United States Patent
Horsch et al.

(10) Patent No.: US 10,197,439 B2
(45) Date of Patent: Feb. 5, 2019

(54) OPTOELECTRONIC SENSOR INCLUDING A LIGHT TRANSMITTER WITH MULTIPLE WAVELENGTH LIGHT TRANSMISSION COMPRISING A MONOLITHIC SEMICONDUCTOR COMPONENT

(71) Applicant: SICK AG, Waldkirch/Breisgau (DE)

(72) Inventors: Ingolf Horsch, Freiburg (DE); Gerhard Merettig, Sexau (DE); Roland Bergbach, Weisweil (DE); Felix Lang, Schliengen (DE); Gunter Leuker, Waldkirch (DE)

(73) Assignee: SICK AG, Waldkirch (DE)

( * ) Notice: Subject to any disclaimer, the term of this patent is extended or adjusted under 35 U.S.C. 154(b) by 208 days.

(21) Appl. No.: 15/209,156

(22) Filed: Jul. 13, 2016

(65) Prior Publication Data
US 2017/0016763 A1 Jan. 19, 2017

(30) Foreign Application Priority Data
Jul. 14, 2015 (DE) .................. 10 2015 111 379

(51) Int. Cl.
*G01J 1/02* (2006.01)
*G01J 1/08* (2006.01)
(Continued)

(52) U.S. Cl.
CPC .............. *G01J 1/08* (2013.01); *G01J 1/0209* (2013.01); *G01J 1/0266* (2013.01);
(Continued)

(58) Field of Classification Search
CPC .......... G01J 1/08; G01J 1/0266; G01J 1/0209; G01J 2001/083; G01S 17/026;
(Continued)

(56) References Cited

U.S. PATENT DOCUMENTS 4,280,131 A * 7/1981 Ono .................... H01L 33/0025
257/653
5,000,569 A 3/1991 Nylund
(Continued)

FOREIGN PATENT DOCUMENTS

DE 68906874 T2 1/1994
DE 19819543 A1 11/1999
(Continued)

OTHER PUBLICATIONS

Office action issued in German application No. 10 2015 111 379.1 dated Mar. 11, 2016.
(Continued)

*Primary Examiner* — Que Tan Le
*Assistant Examiner* — Jennifer D Bennett
(74) *Attorney, Agent, or Firm* — Nath, Goldberg & Meyer; Jerald L. Meyer

(57) ABSTRACT

An optoelectronic sensor for recognizing objects or object properties comprises a light transmitter for transmitting transmitted light into a detection zone, a light receiver for receiving received light and an evaluation unit which is configured to detect an object located in or projecting into a detection zone and/or to determine a property of such an object with reference to the received light received by the light receiver. The light transmitter comprises a monolithic semi-conductor component having a first light emitting layer and a second light emitting layer, with the first light emitting layer being configured for emitting red light and the second light emitting layer being configured for emitting infrared light, and with the second light emitting layer defining a central light emitting surface and the first light emitting layer defining an outer light emitting surface surrounding the central light emitting surface.

19 Claims, 4 Drawing Sheets

(51) Int. Cl.
*G01V 8/10* (2006.01)
*G01V 8/20* (2006.01)
*G01S 17/02* (2006.01)
*G01S 7/481* (2006.01)
*H01L 33/08* (2010.01)

(52) U.S. Cl.
CPC .......... *G01S 7/4815* (2013.01); *G01S 17/026* (2013.01); *G01V 8/10* (2013.01); *G01V 8/20* (2013.01); *H01L 33/08* (2013.01); *G01J 2001/083* (2013.01)

(58) Field of Classification Search
CPC .......... G01S 7/4815; G01V 8/20; G01V 8/10; H01L 33/08
See application file for complete search history.

(56) References Cited

U.S. PATENT DOCUMENTS

| | | | |
|---|---|---|---|
| 5,004,908 A * | 4/1991 | Nakamura | G01V 8/12 250/221 |
| 5,008,529 A | 4/1991 | Nakamura | |
| 5,696,389 A | 12/1997 | Ishikawa et al. | |
| 5,999,553 A * | 12/1999 | Sun | H01S 5/4043 372/23 |
| 7,692,202 B2 | 4/2010 | Bensch | |
| 2003/0124246 A1 | 7/2003 | Chen | |
| 2007/0133093 A1 | 6/2007 | Dobschal | |
| 2007/0158659 A1 | 7/2007 | Bensce | |
| 2008/0054276 A1 | 3/2008 | Vogel | |
| 2008/0179505 A1 | 7/2008 | Inoue | |
| 2008/0211400 A1 | 9/2008 | Kim | |
| 2010/0135144 A1* | 6/2010 | Takahashi | G11B 7/1275 369/112.04 |
| 2010/0299642 A1* | 11/2010 | Merrell | G06F 3/017 715/863 |
| 2011/0299074 A1 | 12/2011 | Kim | |
| 2014/0203312 A1 | 7/2014 | Wu | |
| 2014/0307252 A1 | 10/2014 | Hinderling | |

FOREIGN PATENT DOCUMENTS

| | | |
|---|---|---|
| DE | 10245558 A1 | 4/2004 |
| DE | 102004004765 A1 | 9/2005 |
| DE | 102007038421 B3 | 9/2008 |
| DE | 202009009493 U1 | 9/2009 |
| DE | 202008009090 U1 | 11/2009 |
| DE | 202009012589 U1 | 2/2011 |
| EP | 0329083 A2 | 8/1989 |
| JP | S56165587 U | 12/1981 |
| JP | H06163988 A | 6/1994 |
| JP | H07254732 A | 10/1995 |
| JP | H08247841 A | 9/1996 |
| JP | 2007520071 A | 7/2007 |
| JP | 2007524073 A | 8/2007 |
| JP | 2008098617 A | 4/2008 |
| JP | 2009510762 A | 3/2009 |
| JP | 2012220424 A | 11/2012 |
| WO | 9957788 A2 | 11/1999 |

OTHER PUBLICATIONS

English translation of search results in a Japanese Notice of Allowance dated May 30, 2017 issued in corresponding Japanese Application No. 2016-133161.

* cited by examiner

OPTOELECTRONIC SENSOR INCLUDING A LIGHT TRANSMITTER WITH MULTIPLE WAVELENGTH LIGHT TRANSMISSION COMPRISING A MONOLITHIC SEMICONDUCTOR COMPONENT

The present invention relates to an optoelectronic sensor for recognizing objects or object properties comprising a light transmitter for transmitting transmitted light into a detection zone, a light receiver for receiving received light and an evaluation unit which is configured to detect an object located in or projecting into a detection zone and/or to determine a property of such an object with reference to the received light received by the light receiver.

Such sensors are used in a variety of manners for a contactless detection of objects present in the field of vision of the sensor. Light sensors, for example, serve to determine the distance of an object surface from a reference plane of the sensor. Persons intruding into a secured zone can, for example, be recognized by means of light barriers or light grids. A further area of use of optoelectronic sensors is the determination of specific properties of objects, for example in the form of a color recognition or of an identification of markings or signs on the object side.

The light transmitter of an optoelectronic sensor typically comprises a light emitting diode or a semiconductor laser having a comparatively small spectral linewidth. A large range and a high sensitivity of the associated sensor can generally be achieved using light transmitters which emit infrared light. In specific applications such as in an access control in public areas, it is also desired that the measured light beam is invisible. However, with a lack of visibility of the measured light beam, an alignment of the respective sensor as part of the assembly is made more difficult. This problem can be solved in principle by a second light transmitter emitting visible light whose light is coupled into the optical path of the measured light with the help of beam splitters, optical fibers or the like. This is, however, associated with a considerable effort and corresponding costs. In addition, the additional light transmitter and the required optical components require a considerable construction space. The optical components furthermore reduce the maximum power density and the sharpness.

Sensors which transmit light in different wavelength spectra with respective small spectral linewidth are disclosed in US 2014/0307252 A1, DE 20 2009 012 589 U1, EP 0 329 083 A2 and DE 689 06 874 T2.

Light emitting diodes having a plurality of differently emitting lighting regions are disclosed in DE 10 2004 004 765 A1, WO 99/57788 A2 and US 2008/0211400 A1.

A microscope objective is disclosed in DE 102 45 558 A1 in which a diffraction grating is used to correct the aberration for the examination light without impairing the aberration of the observation light.

It is an object of the invention to provide an optoelectronic sensor which is simple to align, which has high sensitivity, which takes up a small construction space and which can be manufactured inexpensively.

The object is satisfied by an optoelectronic sensor having the features of claim 1.

In accordance with the invention, the light transmitter comprises a monolithic semiconductor component having a first light emitting layer and a second light emitting error, wherein the first light emitting layer is configured for emitting red light and the second light emitting layer is configured for emitting infrared light. The two light emitting layers can be applied to a substrate next to one another and/or above one another as preferably epitaxially grown semiconductor crystal layers. The epitaxial growing of the two light emitting layers can take place in separate processes, with the two separately grown light emitting layers being combined to form a monolithic component by a subsequent bonding process e.g. a wafer-bonding process.

A monolithic semiconductor component, also simply called a "chip" in the following—is therefore provided as the light transmitter which can emit both red light and infrared light. Since the emission of the red light and of the infrared light takes place from one and the same chip, that is so-to-say from the same light source, the construction space taken up by the light transmitter is particularly small. In addition, no beam splitters or the like are required to combine the red light beams and the infrared light beams. This is in particular advantageous because beam-guiding optics not only take up a relatively large amount of room, but above all reduce the maximum achievable power density due to their absorption. The imaging quality, that is, for example, the minimal spot size, is also reduced by beam splitters and similar optical components. The named disadvantages can be avoided by the design of the two light emitting zones as layers on one and the same semiconductor component.

The monolithic component preferably has an edge length of at most 1 mm. The light transmitter can then in principle be used as a single light emitting diode.

If necessary, at least one further red-emitting layer can be provided in addition to the red-emitting layer. Equally, at least one further infrared-emitting layer can be provided in addition to the infrared-emitting layer. In addition, it may be desired due to the application to provide at least one further layer in addition to a red-emitting layer and to an infrared-emitting layer, said further layer emitting in a wavelength spectrum separate from red light and from infrared light, for example in the green spectrum.

The invention provides that the second light emitting layer defines a central light emitting surface and the first light emitting layer defines an outer light surface surrounding the central light emitting surface. It is generally favorable if the infrared detection light beam is provided as the central beam. It could nevertheless be preferred in specific applications to design the first light emitting layer as the central light emitting surface and the second light emitting layer as the outer light emitting surface.

An embodiment of the invention provides that the first light emitting layer is configured for emitting quasi-monochromatic light in the wavelength range from 600 nm to 780 nm and/or that the second light emitting layer is configured for emitting quasi-monochromatic light in the wavelength range of more than 780 nm to 2000 nm. The light emitting layers can in particular each per se be designed like the light emitting layer of a conventional light emitting diode.

An embodiment of the invention provides that the first light emitting layer and the second light emitting layer are applied to a common substrate of the monolithic semiconductor component in a stacked manner, preferably directly after one another. It is possible with an optoelectronic sensor due to the stacked arrangement to provide a coaxial arrangement of detection light (infrared) required for the measurement and of pilot light (red) used, for example, for aligning the sensor without requiring beam splitters or the like for this purpose.

It is preferred that the lower light emitting layer closer to the substrate has a smaller band gap than the upper light emitting layer further remote from the substrate and/or that the second light emitting layer is the lower layer closer to the substrate. Independently of the alignment of the semiconductor component, that light emitting layer is here called the bottommost light emitting layer which is located between the substrate and the other light emitting layer. The other light emitting layer is accordingly to be considered as the upper light emitting layer. The light emitted by the lower light emitting layer has to penetrate the upper light emitting layer at least regionally and could therefore be absorbed therein. Since the red-emitting layer is arranged above the infrared-emitting layer, such absorption losses can be largely avoided. The band gap is generally understood as the energy difference between the valence band and the conductor band of a semiconductor. With a light emitting diode, the energy of the emitted photons corresponds just to the band gap. If therefore the lower light emitting layer has a smaller band gap than the upper light emitting layer, the photons emitted by the lower layer cannot be absorbed on the passage through the upper layer.

A specific embodiment of the invention provides that the upper light emitting layer further remote from the substrate partly covers the lower light emitting layer closer to the substrate, with at least one middle contact for contacting the lower light emitting layer closer to the substrate being arranged in a non-covered region of the lower light emitting layer. The term "middle contact" is used here for a connector contact of a layer which is not an outer layer of the semiconductor component. A selective control of the first light emitting layer and of the second light emitting layer is possible due to the middle contact. In other words, the red-emitting layer and the infrared-emitting layer are individually controllable. The middle contact can be of relatively small design in comparison with the overall light emitting surface so that a light spot of largely the same size can be achieved for the red light and for the infrared light despite the individual controllability.

At least one mirror layer can be arranged between the substrate and the lower light emitting layer closer to the substrate to reflect and thus to utilize the light emitted in the direction of the substrate.

An alternative embodiment of the invention provides that the first light emitting layer and the second light emitting layer are laterally spatially separate from one another. In this embodiment, both light emitting layers can be directly applied to the substrate, for example as epitaxial layers. They can be individually contacted for an individual control.

The first light emitting layer and the second light emitting layer are preferably arranged concentrically on a common substrate of the monolithic semiconductor component. It is hereby ensured that the position of the infrared light beam can be recognized relatively exactly with reference to the position of the red light beam.

Provision can be made that the central light emitting surface is circular or oval and/or that the outer light emitting surface is of closed annular shape or of segmented annular shape. The outer light emitting surface an specifically form an "aiming ring" which is used directly as an alignment aid by a user.

A control device which is configured to individually control the first light emitting layer and the second light emitting layer can be associated with the light transmitter. The control device can for this purpose be connected to the light emitting layers via corresponding electrical conductors and via contacts connected to the layers. The flexibility of the sensor is increased by the separate control options of the two light emitting layers.

The control device can be configured to activate the first light emitting layer only part time during the operation of the optoelectronic sensor. An "activation" of a light emitting layer is in this respect to be understood both as a switching on in the sense of an excitation to permanent lighting and as a setting into a constant or abrupt flashing state. It is desirable in specific applications not to transmit the visible red light constantly.

The control device can in particular be configured only to activate the first light emitting layer when the optoelectronic sensor is in an alignment mode and/or when a switching condition of the optoelectronic sensor is satisfied and/or when the optoelectronic sensor is in a predefined switching state. An alignment mode is to be understood as a special operating state of an optoelectronic sensor which is provided for aligning or adjusting the sensor in a specific application situation. The red light beam serves as a pilot light beam in this operating state and indicates the position of the measured light beam to the user. The switching threshold of a light sensor is to be considered as a "switching condition", for example. A user can recognize whether the sensor is switched on or switched off with reference to the switching condition indicated by the red light. For example, a single, brief lighting up of the red light emitting layer could be initiated when the sensor is switched on. The user then knows that the switching-on procedure was successful.

The control device can also be configured to activate the first light emitting layer when there is a disturbance in normal operation. The red light can in this respect be used as a warning signal to draw a user's attention to any disturbance, defects or dangers.

It is preferred that the monolithic semi-conductor component forms the only light source of the light transmitter. Manufacturing costs, weight and construction space can hereby be saved.

The light transmitter can comprise a color-corrected transmission optics, with the color-corrected transmission optics in particular having at least substantially the same focal length for the red light emitted by the first light emitting layer and for the infrared light emitted by the second light emitting layer. It is thereby achieved that the beam shaping is of substantially the same quality for both wavelengths.

The light transmitter can be designed as an achromatic lens, in the simplest case e.g. as a two-lens objective.

A particularly inexpensive embodiment of the invention provides that the achromatic lens comprises a combination of a refractive optical structure and of a diffractive optical structure and/or is produced from plastic. For example, the achromatic lens can comprise a plastic lens having a diffractive compensation surface and is in particular only formed by such a plastic lens.

The optoelectronic sensor can e.g. be formed as an optical sensor, for example as a changing light sensor, a triangulation sensor, a luminescence sensor or as a contrast sensor. An optical sensor is in particular to be understood as a light sensor which recognizes the presence of light reflected by an object with reference to such light and optionally recognizes its distance.

Alternatively, an optoelectronic sensor in accordance with the invention can be configured as a unidirectional light barrier or as a reflection light barrier.

An optoelectronic sensor in accordance with the invention can also be configured as a color sensor.

Further developments of the invention are also set forth in the dependent claims, in the description and in the enclosed drawing.

The invention will be explained in the following by way of example with reference to the drawing.

FIG. 1 is a schematic diagram of an embodiment of an optoelectronic sensor in accordance with the invention;

FIG. 2 schematically shows the light transmitter of an optoelectronic sensor in accordance with a first embodiment of the invention;

Figure 1:
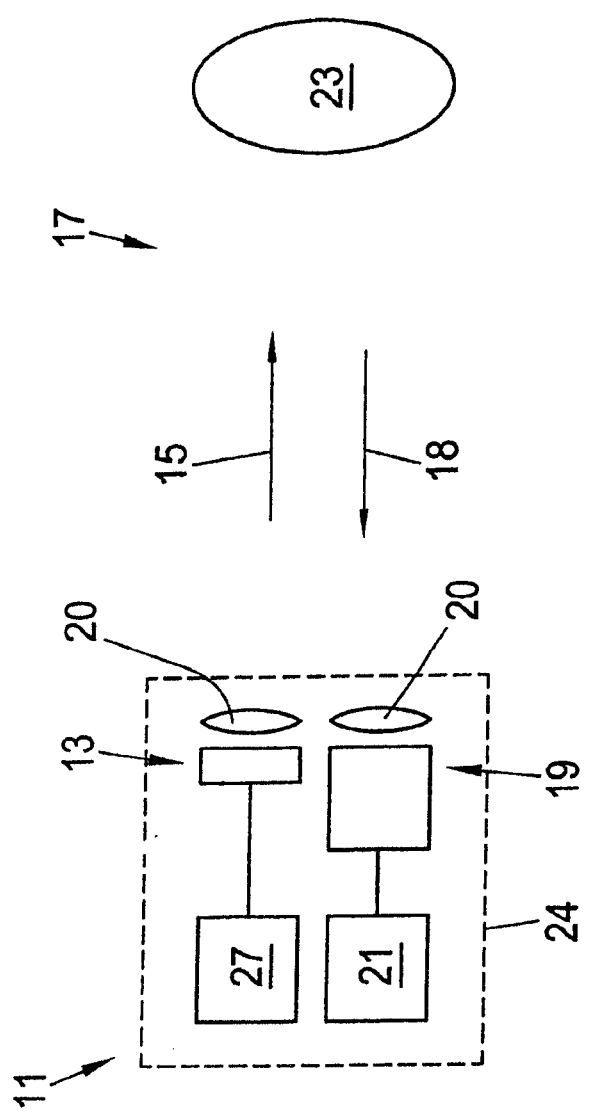

The optoelectronic sensor 11 only shown schematically in FIG. 1, here in the embodiment as a light sensor, comprises a light transmitter 13 which is configured to transmit transmitted light beams 15 into a detection zone 17. An object 23 present in the detection zone 17 reflects or remits the transmitted light beams 15 which then arrive as received light beams 18 on a light receiver 19 of the optoelectronic sensor 11. The light receiver 19 can be a photodiode or a spatially resolving detector such as a diode array or a CCD array. Respective beam shaping optics 20 which are, however, not compulsory for every sensor application, are associated with the light transmitter 13 and the light receiver 19.

An electronic evaluation unit 21 is connected to the light receiver 19 and is able to detect the object and/or to determine a property of the object 23 such as its color in a manner known per se with reference to the received light beams 18 received by the light receiver 18. The light transmitter 13 and the light receiver 19 can be integrated into a common sensor housing 24, as shown in FIG. 1. The light transmitter 13 and the light receiver 19 can, however, generally also be accommodated in separate components if, for example, a unidirectional light barrier is to be provided.

The light transmitter 13 is connected to an electronic control device 27 and can be selectively activated thereby.

Figure 2:
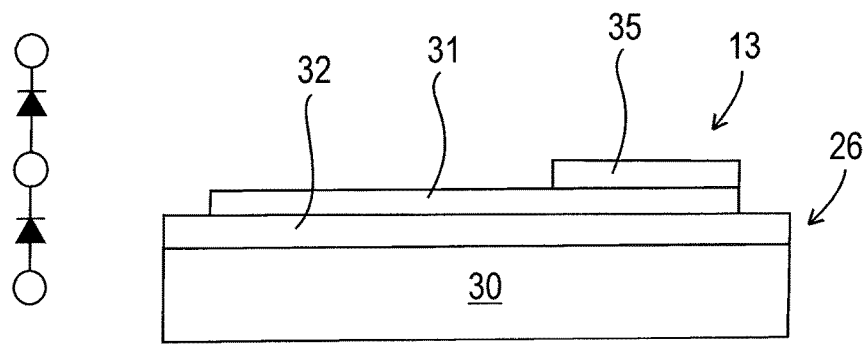

As shown in simplified form in FIG. 2, the light transmitter 13 comprises a monolithic semiconductor component 26 having a substrate 30, having a first light emitting layer 31 and having a second light emitting layer 32. The two light emitting layers 31, 32 are semiconductor layers which are epitaxially applied to the substrate 30 and which are each configured for emitting quasi-monochromatic light. Whereas, however, the lower light emitting layer 32 closer to the substrate 30 in FIG. 2 is configured for emitting infrared light, the upper light emitting layer 31 further remote from the substrate 30 in FIG. 2 is configured for emitting red light. The upper light emitting layer 31 thus has a larger band gap than the lower light emitting layer 32 so that the photons emitted by the lower light emitting layer 32 are not absorbed when passing through the upper light emitting layer 31. The two light emitting layers 31, 32 are connected to the electronic control device 27 in a generally known manner via an electrical contact 35 (FIG. 1). The substrate 30 serves e.g. as the ground in a manner known per se. The symbol corresponding to the light transmitter 13 is indicated in the left area of FIG. 2 for explanation.

In the embodiment of the invention shown in FIG. 2, the two light emitting layers 31, 32. are arranged stacked directly after one another on the substrate 30. In general, however, one or more additional light emitting layers could also be located between the two light emitting layers 31, 32. To increase the light yield, a mirror layer could be arranged between the substrate 30 and the lower light emitting layer 32, but this is not shown in FIG. 2.

Figure 3:
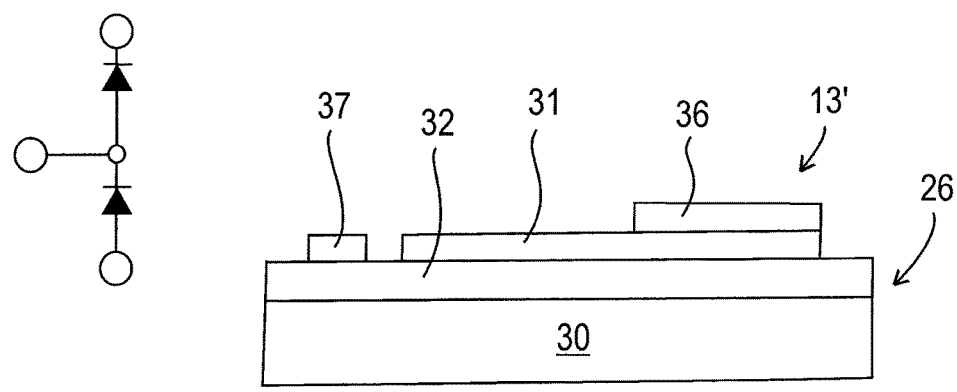
FIG. 3 shows the light transmitter of an optoelectronic sensor in accordance with a second embodiment of the invention.

The light transmitter 13' shown in FIG. 3 and designed in accordance with an alternative embodiment of the invention in principle has the same design as the light transmitter 13 described above with reference to FIG. 2; however, instead of a common electrical contact 35, it has two separate contacts 36, 37 which are associated with the two layers 31, 32. That contact 37 which is associated with the lower light emitting layer 32 is in this respect configured as a middle contact. The upper light emitting layer 31 here therefore only partly covers the lower light emitting layer 32, with the contact 37 configured as a middle contact being arranged in a non-covered region on the lower light emitting layer 32. Due to the separate contacting, the two light emitting layers 31, 32 are individually controllable in the embodiment shown in FIG. 3.

A respective central light emitting surface and an outer light emitting surface are defined by the light emitting layers 31, 32 in the light transmitters 13, 13' shown in FIGS. 2 and 3. The lower light emitting layer 32 is therefore shown larger than the upper light emitting layer 31 in FIGS. 2 and 3.

Figure 4:
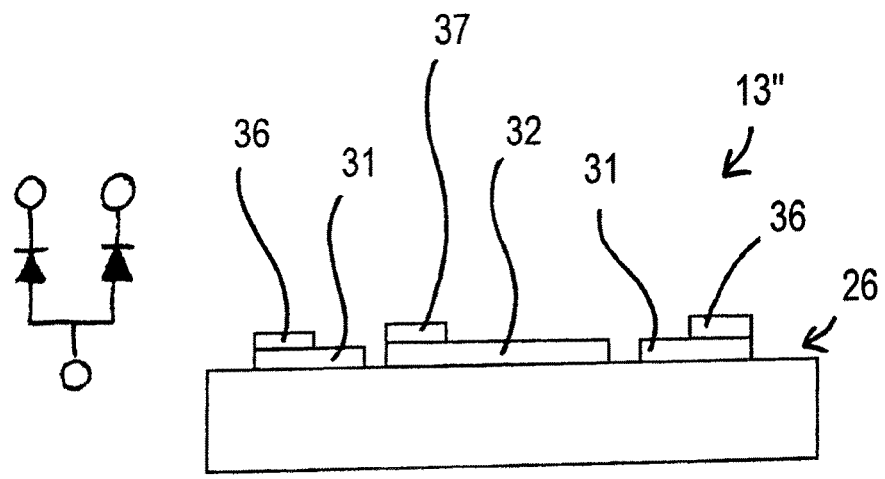
FIG. 4 shows the light transmitter of an optoelectronic sensor in accordance with a third embodiment of the invention.

FIG. 4 shows a further embodiment of a light transmitter 13" for an optoelectronic sensor 11 in accordance with the invention. In this embodiment, the two light emitting layers 31, 32 are likewise connected to the control device 27 via separate contacts 36, 37 (FIG. 1) and are therefore individually controllable. The two layers 31, 32 are here, however, not arranged in a stacked manner, but rather laterally spatially spaced apart from one another. In other words, both the first light emitting layer 31 and the second light emitting layer 32 are directly applied to the substrate 30. If required, however, a mirror layer or other layers could also be provided here between the substrate 30 and the light emitting layers 31, 32. In the embodiment shown in FIG. 4, it is not possible to transmit the red light beam and the infrared light beam exactly coaxially. It is, however, preferred to arrange the first light emitting layer 31 and the second light emitting layer 32 concentrically on the substrate 30 so that a largely coaxial irradiation of red light and infrared light results.

Figure 5:
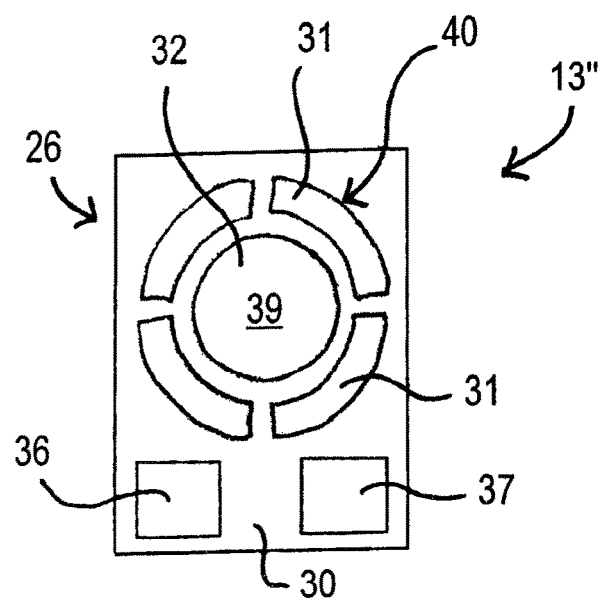
FIG. 5 is a plan view of the light transmitter in accordance with FIG. 4.
Figure 6:
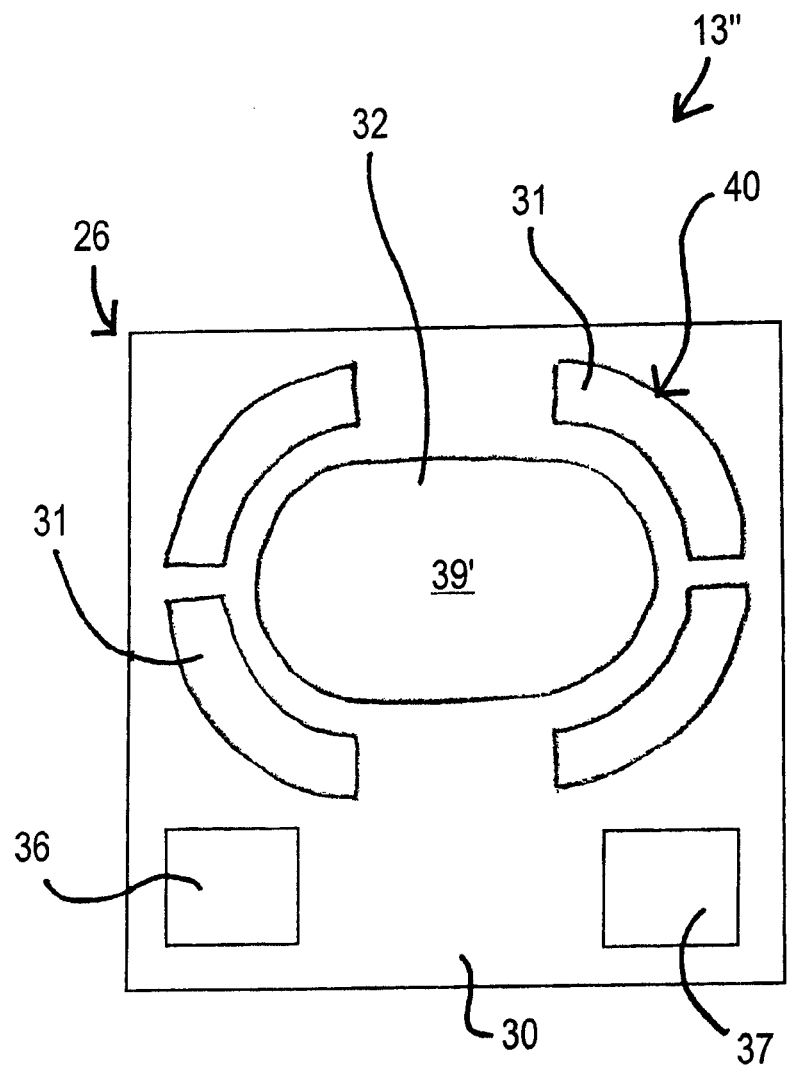
FIG. 6 is a plan view of the light transmitter in accordance with FIG. 4, with the aspect ratio of the central light emitting layer being modified with respect to FIG. 5.

The second light emitting layer 32 can, for example, as shown in FIGS. 5 and 6, define a central light emitting surface 39, whereas the first light emitting layer 31 defines an outer light emitting surface 40 surrounding the central light emitting surface 39. In the embodiment shown in FIG. 5, the central light emitting surface 39 is circular and the outer light emitting surface 40 is of segmented annular shape. In contrast, the central light emitting surface 39' is oval in the embodiment shown in FIG. 6. Due to the oval shape of the central light emitting surface 39', it is possible to achieve a higher energy density on a linear light reception element and thus, for example, to increase the scanning range of an optoelectronic sensor 11 designed as a light scanner. It is sufficient for the outer, red light emitting surface 40 that a design of segmented circular shape is present such as in the embodiment in accordance with FIG. 5 since the red light emitting surface 40 is not decisive for the actuation detection procedure. The red light beam is rather preferably only used as an "aiming ring" for the alignment of the optical sensor 11. To allow a particularly simple alignment in the sense of an aiming, the first light emitting layer 31 could also e.g. be of cross shape in accordance with an embodiment, not shown.

As mentioned above, the light transmitter 13' shown in FIG. 3, just like the light transmitter 13" shown in FIGS. 4-6, can be operated such that, depending on the operating state, only red light, only infrared light or simultaneously red light and infrared light is/are transmitted. It is advantageous for many applications that the red light is only transmitted at times. For this purpose, the first light emitting layer 31 can, for example, only be activated when the optoelectronic sensor 11 is in an alignment mode. The sensor 11 can, for example, be set into the alignment mode by a user by pressing a button. After ending the alignment, the user can—for example likewise by pressing a button—set the sensor 11 into a normal operating state in which only the second light emitting layer 32 is activated and accordingly only infrared light is emitted.

An alternative embodiment provides that, when the optoelectronic sensor 11 is switched on, a brief red light pulse is transmitted to indicate the operation readiness of the optoelectronic sensor 11 to the user. A deactivation of the first light emitting layer 31 corresponding to a switching off of the red light could also be initiated as soon as a switching threshold of the sensor 11 is reached. This can further simplify the setting procedure. The first light emitting layer 31 could also be activated on the presence of a disturbance or in a detected danger situation, with the red light beam serving as a warning signal. A pulsing operation can also be provided for this purpose, for example, so that the impression of a flashing light is given.

To implement the above-indicated specific operating modes, an optical sensor 11 in accordance with the invention can comprise a higher-ranking control unit which is connected to the evaluation unit 21 and to the control device 27, but which is not shown in FIG. 1.

An achromatic lens is preferably associated with the light transmitter 13 as a beam shaping optics 20 and has the same focal length for the red light emitted by the first light emitting layer 31 and for the infrared light emitted by the second light emitting layer 32. The achromatic lens can be designed as a plastic lens having a diffractive compensation surface.

An optical sensor 11 in accordance with the invention can generally be configured as an optical sensor, for example as a changing light sensor (WT), a luminescence sensor (LT)—preferably with background masking (HGA)—or as a contrast sensor (KT). Alternatively, an optical sensor 11 in accordance with the invention could also be configured as a light barrier, a light grating or as a color sensor (CS).

Since the light transmitter 13, 13', 13" has two epitaxial layers as light sources applied to one and the same chip, a measurement can take place in the infrared spectral range and an alignment can take place in the visible red spectral range without separate light emitting diodes or beam combining optics having to be provided for this purpose. The invention thus makes possible a particularly reliable and sensitive object recognition as well as a simple sensor alignment with a simultaneous saving of manufacturing costs, weight and construction space.

REFERENCE NUMERAL LIST

11 optical sensor
13, 13', 13" light transmitter
15 transmitted light beams
17 detection zone
18 received light beams
19 light receiver
20 beam shaping optics
21 evaluation unit
23 object
24 sensor housing
26 semiconductor component
27 control device
30 substrate
31 first light emitting layer
32 second light emitting layer
35 common electrical contact
36 separate electrical contact
37 separate electrical contact
39, 39' central light emitting surface
40 outer light emitting surface

The invention claimed is:

1. An optoelectronic sensor for recognizing objects or object properties, the optoelectronic sensor comprising:
   a light transmitter for transmitting transmitted light into a detection zone, wherein the light transmitter comprises a monolithic semi-conductor component having a first light emitting layer and a second light emitting layer, with the first light emitting layer being configured for emitting red light and the second light emitting layer being configured for emitting infrared light, and with the second light emitting layer defining a central light emitting surface and the first light emitting layer defining an outer light emitting surface surrounding the central light emitting surface;
   a light receiver for receiving received light;
   an evaluation unit which is configured to detect an object located in or projecting into the detection zone and/or to determine a property of such an object with reference to the received light received by the light receiver; and
   a control device which is configured to individually control the first light emitting layer and the second light emitting layer and which is associated with the light transmitter, the control device being configured only to activate the first light emitting layer when the optoelectronic sensor is in an alignment mode.

2. The optoelectronic sensor in accordance with claim 1, wherein the first light emitting layer is configured for emitting quasi-monochromatic light in the wavelength range from 600 nm to 780 nm, and/or wherein the second light emitting layer is configured for emitting quasi-monochromatic light in the wavelength range from more than 780 nm to 2000 nm.

3. The optoelectronic sensor in accordance with claim 1, wherein the first light emitting layer and the second light emitting layer are applied to a common substrate of the monolithic semiconductor component in a stacked manner.

4. The optoelectronic sensor in accordance with claim 3, wherein the first light emitting layer and the second light emitting layer are applied to a common substrate of the monolithic semiconductor component in a stacked manner directly after one another.

5. The optoelectronic sensor in accordance with claim 3, wherein the lower light emitting surface closer to the substrate has a smaller band gap than the upper light emitting layer further remote from the substrate, and/or wherein the second light emitting layer is the lower layer closer to the substrate.

6. The optoelectronic sensor in accordance with claim 3, wherein at least one mirror layer is arranged between the substrate and the lower light emitting layer closer to the substrate.

7. The optoelectronic sensor in accordance with claim 3, wherein the upper light emitting layer further remote from the substrate only partly covers the lower light emitting layer closer to the substrate, with at least one middle contact for contacting the lower light emitting layer closer to the substrate being arranged in a non-covered region of the lower light emitting layer.

8. The optoelectronic sensor in accordance with claim 1, wherein the first light emitting layer and the second light emitting layer are laterally spatially separate from one another.

9. The optoelectronic sensor in accordance with claim 1, wherein the central light emitting surface is circular or oval, and/or wherein the outer light emitting surface is of closed annular shape or segmented annular shape.

10. The optoelectronic sensor in accordance with claim 1, wherein the first light emitting layer and the second light emitting layer are arranged concentrically on a common substrate of the monolithic semiconductor component.

11. The optoelectronic sensor in accordance with claim 1, wherein the monolithic semiconductor component forms the only light source of the light transmitter.

12. The optoelectronic sensor in accordance with claim 1, wherein the light transmitter comprises a color-corrected transmission optics.

13. The optoelectronic sensor in accordance with claim 12, wherein the color-corrected transmission optics has at least substantially the same focal length for the red light emitted by the first light emitting layer and for the infrared light emitted by the second light emitting layer.

14. The optoelectronic sensor in accordance with claim 12, wherein the light transmitter is designed as an achromatic lens.

15. The optoelectronic sensor in accordance with claim 14, wherein the achromatic lens comprises a combination of a refractive optical structure and of a diffractive optical structure and/or being produced from plastic.

16. The optoelectronic sensor in accordance with claim 1, wherein the optoelectronic sensor is configured as one of an optical sensor, a changing light sensor, a triangulation sensor, a luminescence sensor and a contrast sensor.

17. The optoelectronic sensor in accordance with claim 1, wherein the optoelectronic sensor is configured as a unidirectional light barrier or as a reflected light barrier.

18. The optoelectronic sensor in accordance with claim 1, wherein the optoelectronic sensor is configured as a color sensor.

19. An optoelectronic sensor for recognizing objects or object properties, comprising:
    a light transmitter for transmitting transmitted light into a detection zone, wherein the light transmitter comprises a monolithic semi-conductor component having a first light emitting layer and a second light emitting layer, with the first light emitting layer being configured for emitting red light and the second light emitting layer being configured for emitting infrared light, and with the second light emitting layer defining a central light emitting surface and the first light emitting layer defining an outer light emitting surface surrounding the central light emitting surface;
    a light receiver for receiving received light; and
    an evaluation unit which is configured to detect an object located in or projecting into the detection zone and/or to determine a property of such an object with reference to the received light received by the light receiver,
    wherein the first light emitting layer and the second light emitting layer are applied to a common substrate of the monolithic semiconductor component in a stacked manner such that the infrared light emitted by the second light emitting layer travels both through and around the first light emitting layer.

\* \* \* \* \*